(12) United States Patent
Kwon et al.

(10) Patent No.: US 11,810,947 B2
(45) Date of Patent: Nov. 7, 2023

(54) SEMICONDUCTOR DEVICE

(71) Applicant: Samsung Electronics Co., Ltd., Suwon-si (KR)

(72) Inventors: Hyukwoo Kwon, Seoul (KR); Ha-young Yi, Seongnam-si (KR); Byoungdeog Choi, Suwon-si (KR); Seongmin Choo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 65 days.

(21) Appl. No.: 17/536,524

(22) Filed: Nov. 29, 2021

(65) Prior Publication Data

US 2022/0085150 A1 Mar. 17, 2022

Related U.S. Application Data

(63) Continuation of application No. 16/282,548, filed on Feb. 22, 2019, now Pat. No. 11,211,447.

(30) Foreign Application Priority Data

Jul. 23, 2018 (KR) .................. 10-2018-0085553

(51) Int. Cl.
*H01L 45/00* (2006.01)
*H01L 49/02* (2006.01)
*H01L 21/311* (2006.01)
*H10B 12/00* (2023.01)

(52) U.S. Cl.
CPC ........ *H01L 28/90* (2013.01); *H01L 21/31116* (2013.01); *H01L 21/31144* (2013.01); *H01L 28/92* (2013.01); *H10B 12/033* (2023.02)

(58) Field of Classification Search
CPC .......... H01L 28/82; H01L 28/84; H01L 28/86
See application file for complete search history.

(56) References Cited

U.S. PATENT DOCUMENTS

| 5,077,688 | A | 12/1991 | Kumanoya et al. |
| 5,134,086 | A | 7/1992 | Ahn |
| 5,447,878 | A | 9/1995 | Park et al. |
| 6,238,973 | B1 | 5/2001 | Pyun |
| 6,255,159 | B1 | 7/2001 | Thakur |
| 6,307,730 | B1 | 10/2001 | Yamanishi |
| 6,376,328 | B1 | 4/2002 | Aiso et al. |
| 7,547,628 | B2 | 6/2009 | Ikeda |
| 7,951,668 | B2 | 5/2011 | Wu et al. |

(Continued)

FOREIGN PATENT DOCUMENTS

| CN | 103681676 A | 3/2014 |
| CN | 107017235 A | 8/2017 |

(Continued)

*Primary Examiner* — Mark V Prenty
(74) *Attorney, Agent, or Firm* — Harness, Dickey & Pierce, P.L.C.

(57) ABSTRACT

A semiconductor device includes a substrate, a bottom electrode on the substrate, a first support layer on the substrate next to a sidewall of the bottom electrode, a dielectric layer covering the sidewall and a top surface of the bottom electrode, and a top electrode on the dielectric layer. The bottom electrode includes a first part having a plurality of protrusions that protrude from a sidewall of the first part. The first part of the bottom electrode may be on the first support layer.

20 Claims, 16 Drawing Sheets

(56) References Cited

U.S. PATENT DOCUMENTS

| | | |
|---|---|---|
| 8,679,935 B2 | 3/2014 | Lee et al. |
| 8,946,855 B2 | 2/2015 | Sohn |
| 9,093,500 B2 | 7/2015 | Park et al. |
| 9,142,558 B2 | 9/2015 | Yang et al. |
| 9,147,685 B2 | 9/2015 | Byun et al. |
| 9,240,441 B2 | 1/2016 | Yoon et al. |
| 9,240,442 B2 | 1/2016 | Lim et al. |
| 9,263,536 B2 | 2/2016 | Kim et al. |
| 9,293,336 B2 | 3/2016 | Yang et al. |
| 9,373,681 B2 | 6/2016 | Lim et al. |
| 9,570,448 B2 | 2/2017 | Choi et al. |
| 9,853,032 B2 | 12/2017 | Seo |
| 9,941,286 B2 | 4/2018 | Kim et al. |
| 9,978,753 B2 | 5/2018 | Ahn et al. |
| 11,211,447 B2 * | 12/2021 | Kwon .................. H10B 12/033 |
| 2002/0036312 A1 | 3/2002 | Bertagnolli et al. |
| 2002/0090778 A1 | 7/2002 | Kim |
| 2005/0026452 A1 | 2/2005 | Lee et al. |
| 2005/0275007 A1 | 12/2005 | Kawasaki et al. |
| 2010/0203699 A1 | 8/2010 | Tokashiki |
| 2011/0092036 A1 | 4/2011 | Nakamura |
| 2012/0064680 A1 | 3/2012 | Oh et al. |
| 2012/0125879 A1 | 5/2012 | Park et al. |
| 2012/0231601 A1 | 9/2012 | Lee et al. |

FOREIGN PATENT DOCUMENTS

| | | |
|---|---|---|
| CN | 107634047 A | 1/2018 |
| JP | H06326266 A | 11/1994 |
| JP | 2001/510945 A | 8/2001 |
| JP | 2002538603 A | 11/2002 |
| JP | 2011086759 A | 4/2011 |
| KR | 20080108697 A | 12/2008 |
| KR | 10-2010-0078971 A | 7/2010 |
| KR | 10-2011-0078064 A | 7/2011 |
| KR | 2012-0102386 A | 9/2012 |
| KR | 10-2014-0074655 A | 6/2014 |
| KR | 10-1614029 B1 | 4/2016 |

\* cited by examiner

SEMICONDUCTOR DEVICE

CROSS-REFERENCE TO RELATED APPLICATION

This U.S. nonprovisional application is a continuation of U.S. application Ser. No. 16/282,548, filed Feb. 22, 2019, which claims priority under 35 U.S.C § 119 to Korean Patent Application No. 10-2018-0085553, filed on Jul. 23, 2018 in the Korean Intellectual Property Office, the entire contents of each of which are hereby incorporated by reference.

BACKGROUND

Inventive concepts relate to a semiconductor device, and more particularly, to a semiconductor device with improved reliability.

There has recently been an increasing demand for light, small, fast, multifunctional, excellently performing, and highly reliable products in the electronic industry such as mobile phones and laptop computers. To meet these requirements, it is demanded to increase integration and also to improve performance of semiconductor memory devices.

A highest increase in capacity of a capacitor is one approach to improve reliability of highly-integrated semiconductor memory devices. The higher an aspect ratio of a capacitor bottom electrode, the larger the capacity of the capacitor. Thus, research has been variously conducted on process technology for forming the capacitor whose aspect ratio is high.

SUMMARY

Some example embodiments of inventive concepts provide a semiconductor device with improved reliability.

Some example embodiments of inventive concepts provide a method of fabricating a semiconductor device with improved reliability.

Feature and/or effects of inventive concepts are not limited to the mentioned above, and other features and/or effects which have not been mentioned above will be clearly understood to those skilled in the art from the following description.

According to some example embodiments of inventive concepts, a semiconductor device may include a substrate, a bottom electrode on the substrate, a first support layer on the substrate next to a sidewall of the bottom electrode, a dielectric layer covering the sidewall of the bottom electrode and a top surface of the bottom electrode, and a top electrode on the dielectric layer. The bottom electrode may include a first part including a plurality of protrusions that protrude from a sidewall of the first part. The first part of the bottom electrode may be on the first support layer.

According to some example embodiments of inventive concepts, a semiconductor device may include a substrate, a bottom electrode on the substrate, a dielectric layer covering a surface of the bottom electrode, and a top electrode on the dielectric layer. The bottom electrode may include a plurality of protrusions that protrude from a sidewall of the bottom electrode. The plurality of protrusions may have convexly curved surfaces.

According to some example embodiments of inventive concepts, a semiconductor device may include a substrate, a plurality of bottom electrodes on the substrate, a dielectric layer, and a top electrode on the dielectric layer. Each of the plurality of bottom electrodes may include a sidewall, and a plurality of first parts that may be between the plurality of protrusions and may be vertically spaced apart from each other. The plurality of bottom electrodes may include a first bottom electrode and a second bottom electrode. Distances between the plurality of first parts of the first bottom electrode and distances between the plurality of first parts of the second bottom electrode may be uniform.

DETAILED DESCRIPTION

Figure 1:
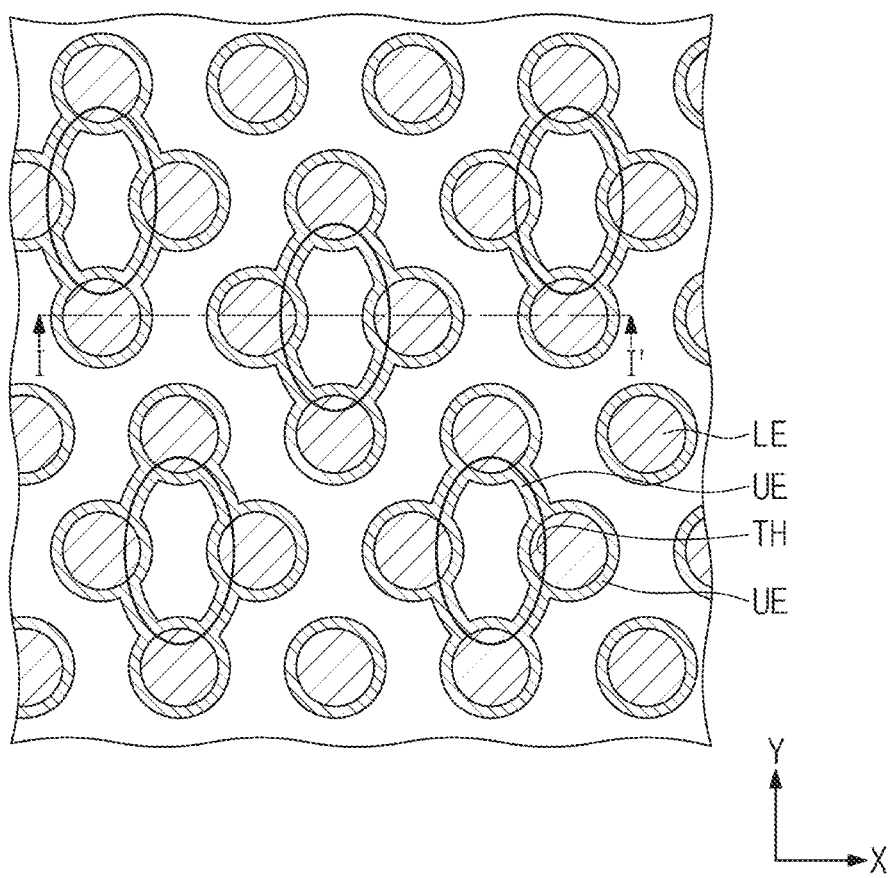
FIG. 1 illustrates a plan view showing a semiconductor device according to some example embodiments of inventive concepts.
Figure 2:
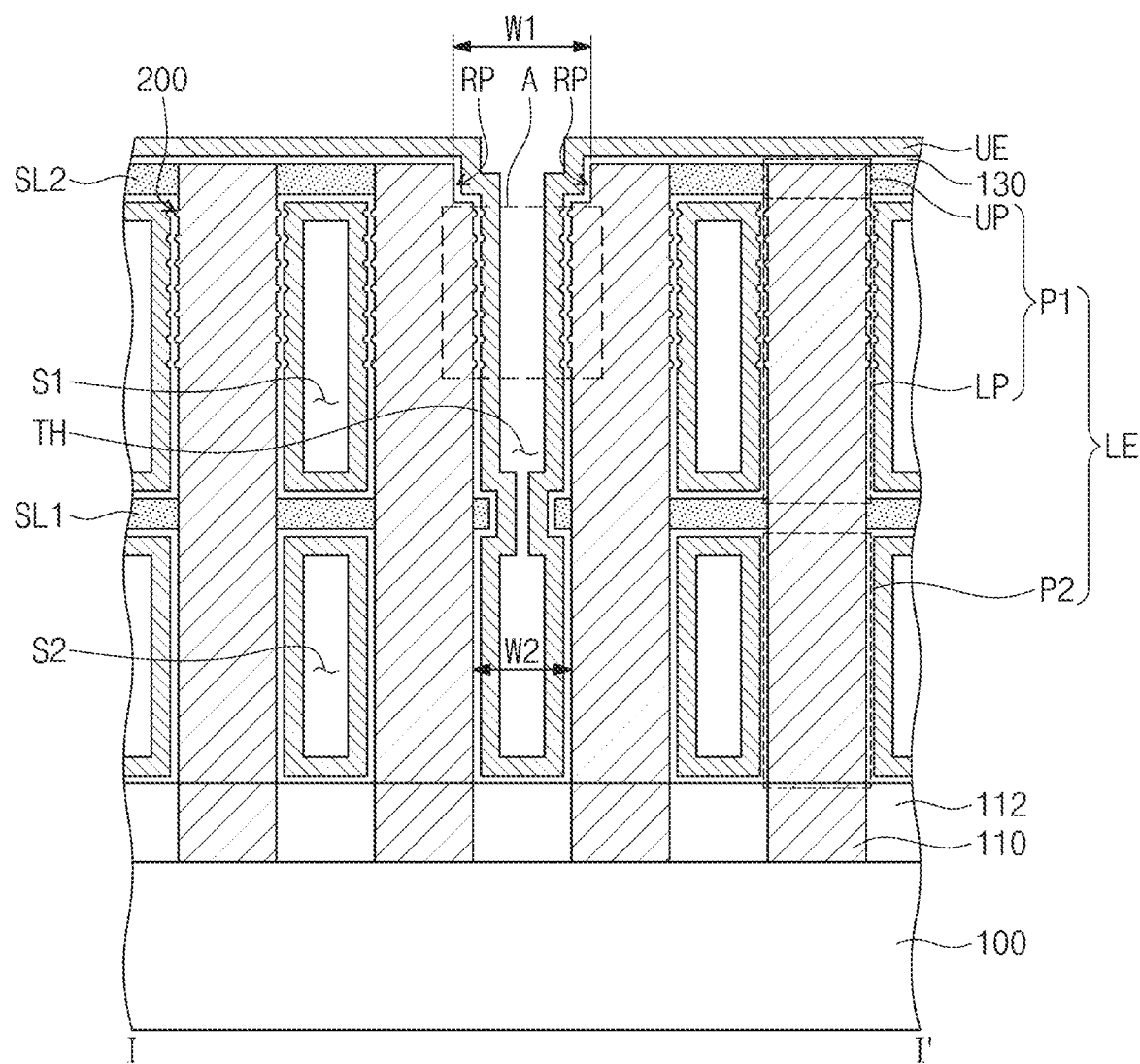
FIG. 2 illustrates a cross-sectional view taken along line I-I' of FIG. 1, showing a semiconductor device according to some example embodiments of inventive concepts.
Figure 3:
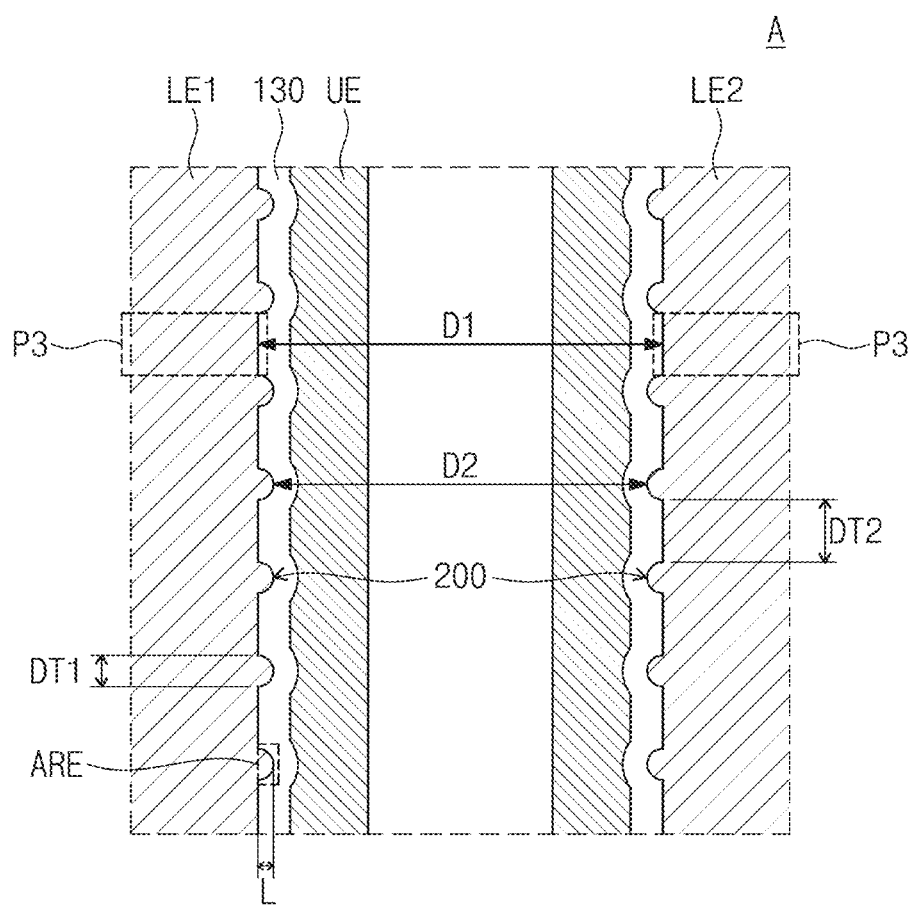
FIG. 3 illustrates an enlarged view showing section A of FIG. 2.

FIG. 1 illustrates a plan view showing a semiconductor device according to some example embodiments of inventive concepts. FIG. 2 illustrates a cross-sectional view taken along line I-I' of FIG. 1, showing a semiconductor device according to some example embodiments of inventive concepts. FIG. 3 illustrates an enlarged view showing section A of FIG. 2.

Referring to FIGS. 1 and 2, a semiconductor device may include contact plugs 110, bottom electrodes LE, a first support layer SL1, a second support layer SL2, a dielectric layer 130, and a top electrode UE.

The contact plugs 110 may be disposed on a substrate 100. The substrate 100 may be a semiconductor substrate, such as a silicon (Si) substrate, a germanium (Ge) substrate, or a silicon-germanium (SiGe) substrate. The contact plugs 110 may be arranged in a zigzag fashion along a first direction X. The contact plugs 110 may include one or more of a semiconductor material (e.g., polysilicon), a metal-semiconductor compound (e.g., tungsten silicide), a conductive metal nitride layer (e.g., titanium nitride, tantalum nitride, or tungsten nitride), and a metallic material (e.g., titanium, tungsten, or tantalum).

An interlayer dielectric layer 112 may be disposed on the substrate 100. The interlayer dielectric layer 112 may fill a gap between the contact plugs 110 adjacent to each other. The interlayer dielectric layer 112 may include one or more of a silicon oxide layer, a silicon nitride layer, and a silicon oxynitride layer. Although not shown, the substrate 100 may be provided thereon and/or therein with a plurality of word lines and a plurality of bit lines crossing the word lines. The interlayer dielectric layer 112 may be formed to cover the word lines and the bit lines. Impurity regions may be formed in the substrate 100 on opposite sides of each of the word lines, and each of the contact plugs 110 may be connected to one of the impurity regions.

The bottom electrodes LE may be disposed on the contact plugs 110. Each of the bottom electrodes LE may have a pillar or cylindrical shape. The bottom electrodes LE may include, for example, one or more of a metallic material (e.g., cobalt, titanium, nickel, tungsten, or molybdenum), a metal nitride layer (e.g., a titanium nitride (TiN) layer, a titanium silicon (TiSiN) layer, a titanium aluminum nitride (TiAlN) layer, a tantalum nitride (TaN) layer, a tantalum aluminum nitride (TaAlN) layer, or tungsten nitride (WN) layer), a noble metal layer (e.g., platinum (Pt), ruthenium (Ru), or iridium (Ir)), a conductive oxide layer (e.g., PtO, $RuO_2$, $IrO_2$, $SRO(SrRuO_3)$, $BSRO((Ba,Sr)RuO_3)$, CRO ($CaRuO_3$), LSCo), and a metal silicide layer. The bottom electrodes LE will be further discussed in detail below.

The first support layer SL1 may be disposed on sidewalls of the bottom electrodes LE. The first support layer SL1 may surround portions of the sidewalls of the bottom electrodes LE. The second support layer SL2 may be disposed on the sidewalls of the bottom electrodes LE, while being placed over the first support layer SL1. The second support layer SL2 may surround other portions of the sidewalls of the bottom electrodes LE. The second support layer SL2 and the first support layer SL1 may be spaced apart from each other in a direction perpendicular to a top surface of the substrate 100. The second support layer SL2 may have a top surface at the same level as that of top surfaces of the bottom electrodes LE. The first support layer SL1 may be closer than the second support layer SL2 to the substrate 100. The first and second support layers SL1 and SL2 may be, for example, a silicon carbonitride (SiCN) layer.

Each of the bottom electrodes LE may include a first part P1 and a second part P2. The first part P1 may be positioned on (or over) the first support layer SL1, and the second part P2 may be positioned under the first support layer SL1. The first part P1 may include a lower segment LP and an upper segment UP. The lower segment LP may be disposed between the first support layer SL1 and the second support layer SL2, and the upper segment UP may be disposed on the lower segment LP and may horizontally overlap the second support layer SL2. The lower segment LP of the bottom electrode LE may have an uneven sidewall. The lower segment LP of the bottom electrode LE may have a plurality of protrusions 200 that protrude from the sidewall of the lower segment LP. The number of the plurality of protrusions 200 may be equal to or greater than two. The plurality of protrusions 200 may be spaced apart from each other in the vertical direction. The plurality of protrusions 200 may be disposed spaced apart from the first support layer SL1. The plurality of protrusions 200 may have convexly curved surfaces. The plurality of protrusions 200 may have different sizes from each other. As shown in FIG. 3, the plurality of protrusions 200 may have protruding lengths L different from each other. As shown in FIG. 3, the plurality of protrusions 200 may have cross-sectional areas ARE different from each other. Each of the plurality of protrusions 200 may have a vertical thickness DT1 of about 3 nm to about 7 nm.

Referring to FIG. 3, the bottom electrodes LE may include a first bottom electrode LE1 and a second bottom electrode LE2 adjacent to each other. Each of the first and second bottom electrodes LE1 and LE2 may include third parts P3 between the protrusions 200 adjacent to each other in the vertical direction. First distances D1 between the third parts P3 of the first and second bottom electrodes LE1 and LE2 may be uniform. The protrusions 200 of the first and second bottom electrodes LE1 and LE2 adjacent to each other may be spaced apart from each other at a second distance D2 less than the first distance D1. Each of the third parts P3 may have a vertical thickness DT2 of about 7 nm to about 25 nm. The third parts P3 may have their flat sidewalls. The sidewalls of the third parts P3 may be substantially perpendicular to the top surface of the substrate 100.

Referring back to FIG. 2, the second part P2 of each of the bottom electrodes LE may have an entirely flat sidewall. For example, different to the first part P1, the second part P2 may have no protrusions that protrude from a sidewall of the second part P2. The sidewall of the second part P2 may be substantially perpendicular to the top surface of the substrate 100. The bottom electrodes LE may have their concave segments RP (e.g., step segments) that are recessed from the top surfaces of the bottom electrodes LE. For example, the concave segments RP may be disposed on portions of upper corners of the bottom electrodes LE. The second support layer SL2 may expose sidewalls and top surfaces of the bottom electrodes LE, which sidewalls and top surfaces are disposed in the concave segments RP.

Through holes TH may be disposed between the bottom electrodes LE adjacent to each other. Each of the through holes TH may be disposed between a pair of the bottom electrodes LE adjacent to each other in the first direction X and also between a pair of the bottom electrodes LE adjacent to each other in a second direction Y intersecting the first direction X. For example, the through hole TH may extend from the concave segments RP, which are exposed by the second support layer SL2, of the bottom electrodes LE toward a gap between the lower segments LP of the bottom electrodes LE. The through hole TH may extend from the first support layer SL1 between the lower segments LP of the bottom electrodes LE toward a gap between the second parts P2 of the bottom electrodes LE, while penetrating the first support layer SL1. The through hole TH may have a first width W1 at a top end thereof greater than a second width W2 at a bottom end thereof (W1>W2). When viewed in plan, a plurality of the through holes TH may be arranged in a zigzag fashion along the first direction X.

The top electrode UE may be disposed on the bottom electrodes LE. The top electrode UE may be disposed on the top surfaces of the bottom electrodes LE, the sidewalls of the bottom electrodes LE exposed by the first and second support layers SL1 and SL2, top and bottom surfaces of the first and second support layers SL1 and SL2, and lateral surfaces of the first support layer SL1. For example, the top electrode UE may have a thickness that is less than half the second width W2 of each of the through holes TH. The thickness of the top electrode UE may be less than half a width of each of first spaces S1 defined by the first and second support layers SL1 and SL2 between the bottom electrodes LE. The thickness of the top electrode UE may be less than half a width of each of second spaces S2 defined by the interlayer dielectric layer 112 and the first support layer SL1 between the bottom electrodes LE. In this case, the top electrode UE may fill neither the through holes TH, nor the first spaces S1, nor the second spaces S2. The top electrode UE may be formed of one or more of an impurity-doped semiconductor material, a metallic material, a metal nitride material, and a metal silicide material. The top electrode UE may be formed of a refractory metallic material, such as cobalt, titanium, nickel, tungsten, and molybdenum. The top electrode UE may be formed of metal nitride, such as titanium nitride (TiN), titanium aluminum nitride (TiAlN), and tungsten nitride (WN). The top electrode UE may be formed of metal, such as platinum (Pt), ruthenium (Ru), and iridium (Ir).

The dielectric layer 130 may be interposed between the top electrode UE and the bottom electrodes LE. The dielectric layer 130 may conformally cover the top surfaces of the bottom electrodes LE, the sidewalls of the bottom electrodes LE exposed by the first and second support layers SL1 and SL2, the top and bottom surfaces of the first and second support layers SL1 and SL2, and the lateral surfaces of the first support layer SL1. The dielectric layer 130 may have the same surface profile as those of the bottom electrodes LE. For example, the dielectric layer 130 may have an uneven surface between the first and second support layers SL1 and SL2. The dielectric layer 130 may be formed of a single layer, or a combination thereof, including at least one selected from the group consisting of metal oxide, such as $HfO_2$, $ZrO_2$, $Al_2O_3$, $La_2O_3$, $Ta_2O_3$, and $TiO_2$, and a perovskite dielectric material, such as $SrTiO_3$(STO), (Ba,Sr)$TiO_3$ (BST), $BaTiO_3$, PZT, and PLZT.

Figure 4:
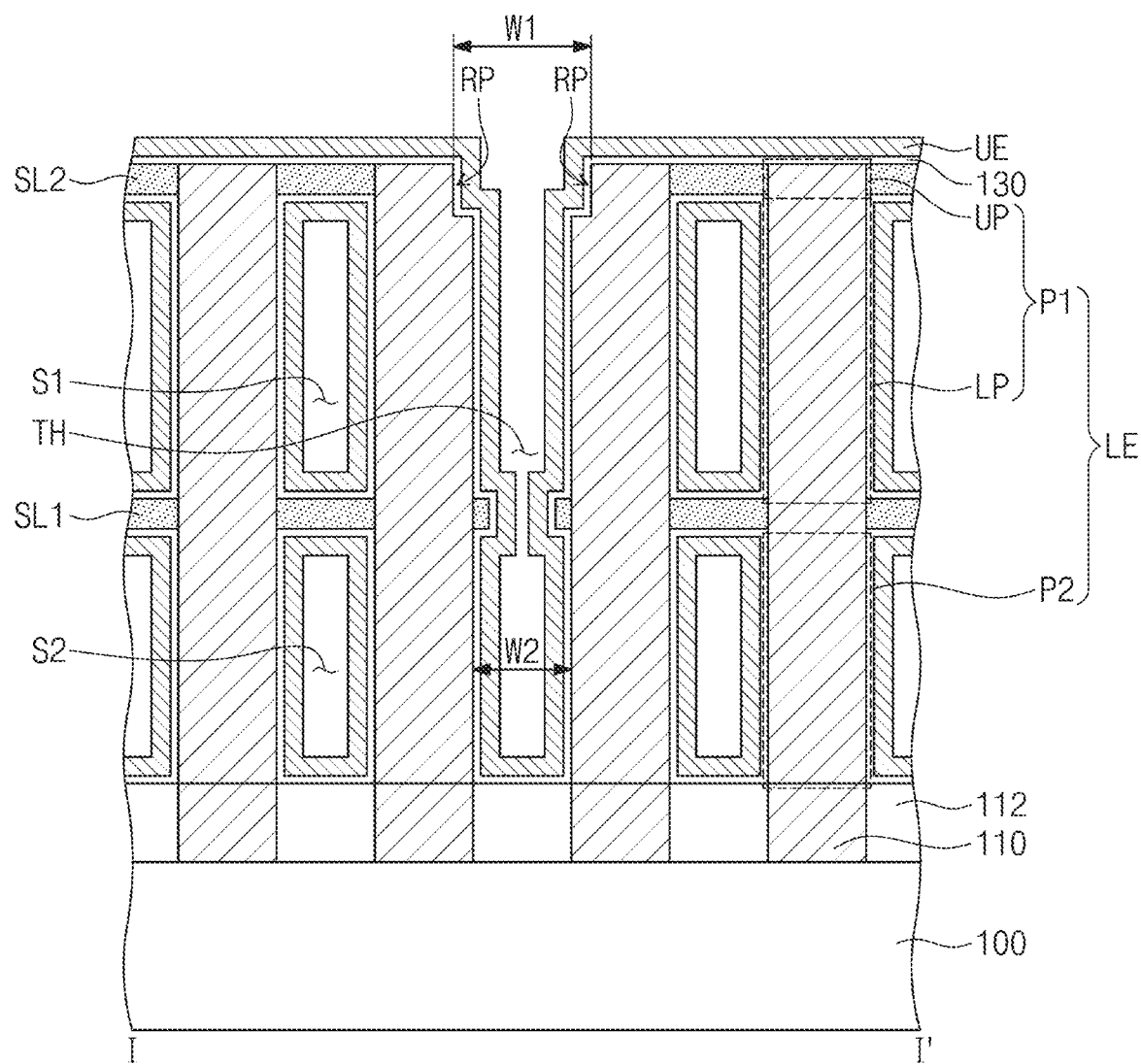
FIG. 4 illustrates a cross-sectional view taken along line I-I' of FIG. 1, showing a semiconductor device according to some example embodiments of inventive concepts.

FIG. 4 illustrates a cross-sectional view taken along line I-I' of FIG. 1, showing a semiconductor device according to some example embodiments of inventive concepts. For brevity of description, a detailed explanation of technical features the same as those of the semiconductor device discussed above may be omitted, and a difference thereof will be described.

Referring to FIG. 4, the first parts P1 of the bottom electrodes LE may have entirely flat sidewalls. For example, the sidewalls of the lower segments LP of the bottom electrodes LE may be entirely flat, and may be substantially perpendicular to the top surface of the substrate 100. The upper segments UP of the bottom electrodes LE may have entirely flat sidewalls, which flat sidewalls may be substantially perpendicular to the top surface of the substrate 100. In certain embodiments, the plurality of protrusions 200 may not be provided on the sidewalls of the lower segments LP of the bottom electrodes LE.

Figure 5:
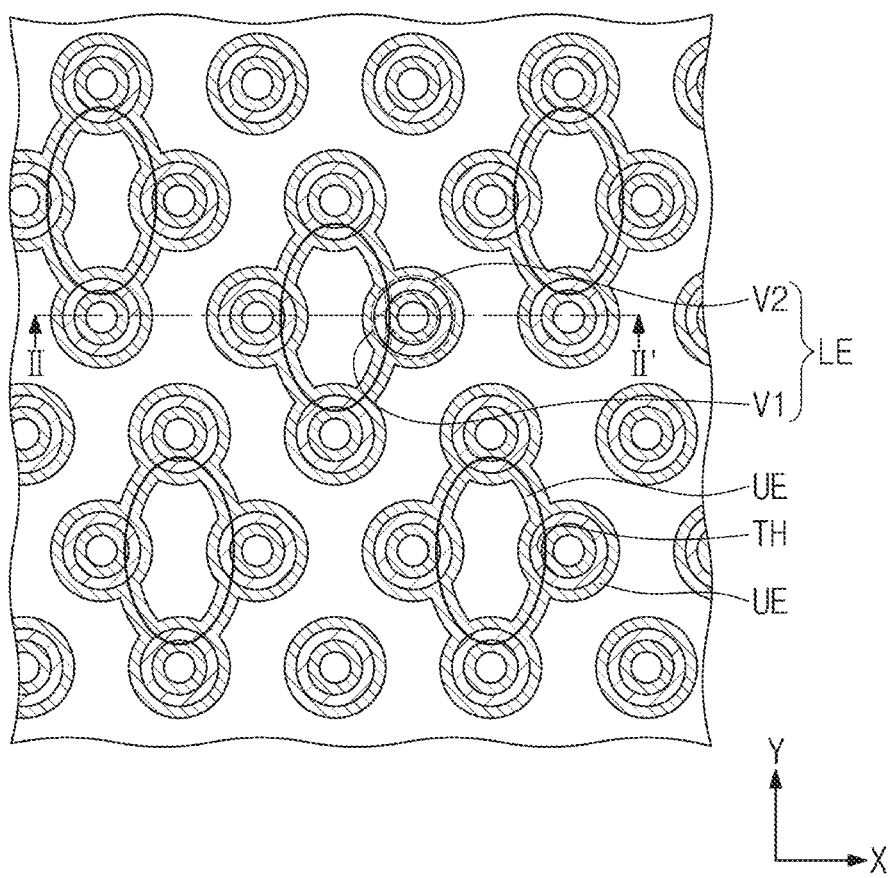
FIG. 5 illustrates a plan view showing a semiconductor device according to some example embodiments of inventive concepts.
Figure 6:
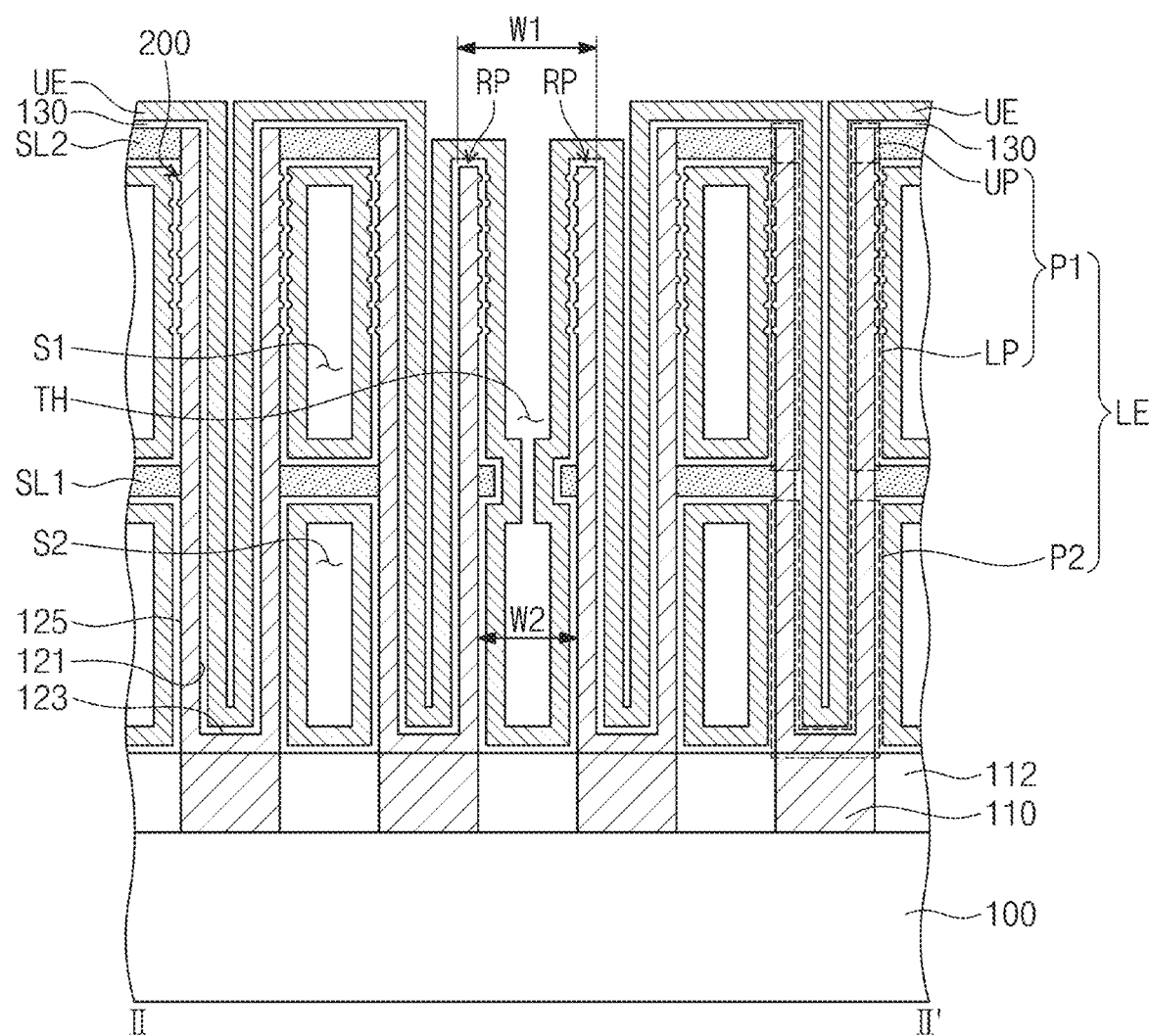
FIG. 6 illustrates a cross-sectional view taken along line II-II' of FIG. 5, showing a semiconductor device according to some example embodiments of inventive concepts.
Figure 7:
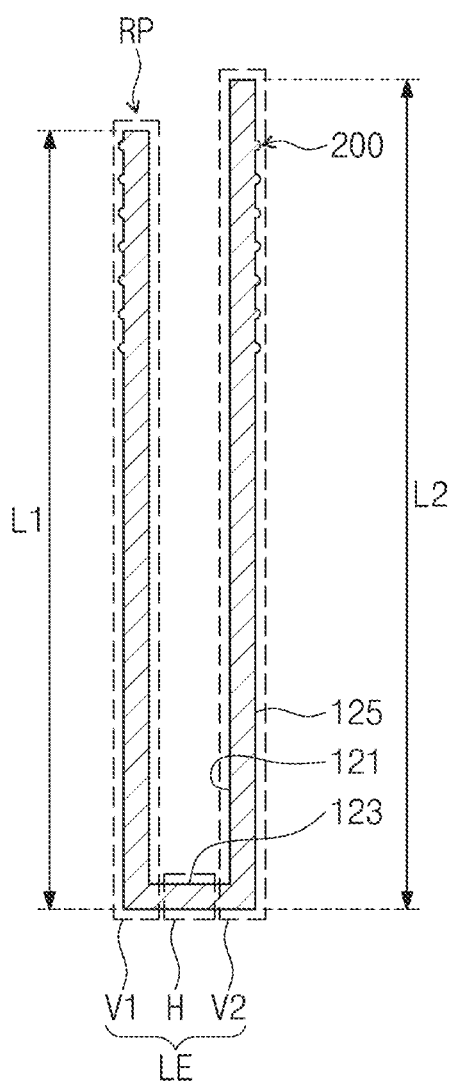
FIG. 7 illustrates an enlarged cross-sectional view showing bottom electrodes according to some example embodiments of inventive concepts.

FIG. 5 illustrates a plan view showing a semiconductor device according to some example embodiments of inventive concepts. FIG. 6 illustrates a cross-sectional view taken along line II-II' of FIG. 5, showing a semiconductor device according to some example embodiments of inventive concepts. FIG. 7 illustrates an enlarged cross-sectional view showing bottom electrodes according to some example embodiments of inventive concepts. For brevity of description, a detailed explanation of technical features the same as those of the semiconductor device discussed above may be omitted, and a difference thereof will be described.

Referring to FIGS. 5 to 7, each of the bottom electrodes LE may include a first vertical segment V1, a second vertical segment V2, and a horizontal segment H. When viewed in cross-section, the first and second vertical segments V1 and V2 may extend in parallel along the vertical direction. The horizontal segment H may lie between and connect the first and second vertical segments V1 and V2. The first vertical segment V1 may have a top surface that is exposed to the through hole TH, and the second vertical segment V2 may have a top surface that is not exposed to the through hole TH. The top surface of the first vertical segment V1 may correspond to the top surface of the bottom electrode LE, which top surface of the bottom electrode LE is disposed in the concave segment RP. The first vertical segment V1 may have a vertical length L1 less than a vertical length L2 of the second vertical segment V2 (L1<L2). The bottom electrode LE may have a U shape when viewed in cross-section and a ring shape when viewed in plan.

The plurality of protrusions 200 may be disposed outer sidewalls 125 of the first parts P1 of the bottom electrodes LE. For example, the plurality of protrusions 200 may be disposed on the outer sidewalls 125 of the lower segments LP of the bottom electrodes LE, and the outer sidewalls 125 may be uneven. The bottom electrodes LE may have entirely flat inner sidewalls 121 and entirely flat floor surfaces 123. For example, the plurality of protrusions 200 may not be provided on the inner sidewalls 121 of the lower segments LP.

The top electrode UE may be disposed on surfaces of the bottom electrodes LE. For example, the top electrode UE may be disposed on the top surfaces of the bottom electrodes LE, the inner sidewalls 121 and the floor surfaces 123 of the bottom electrodes LE, the outer sidewalls 125 of the bottom electrodes LE exposed by the first and second support layers SL1 and SL2, the top and bottom surfaces of the first and second support layers SL1 and SL2, and the lateral surfaces of the first support layer SL1.

Figure 8:
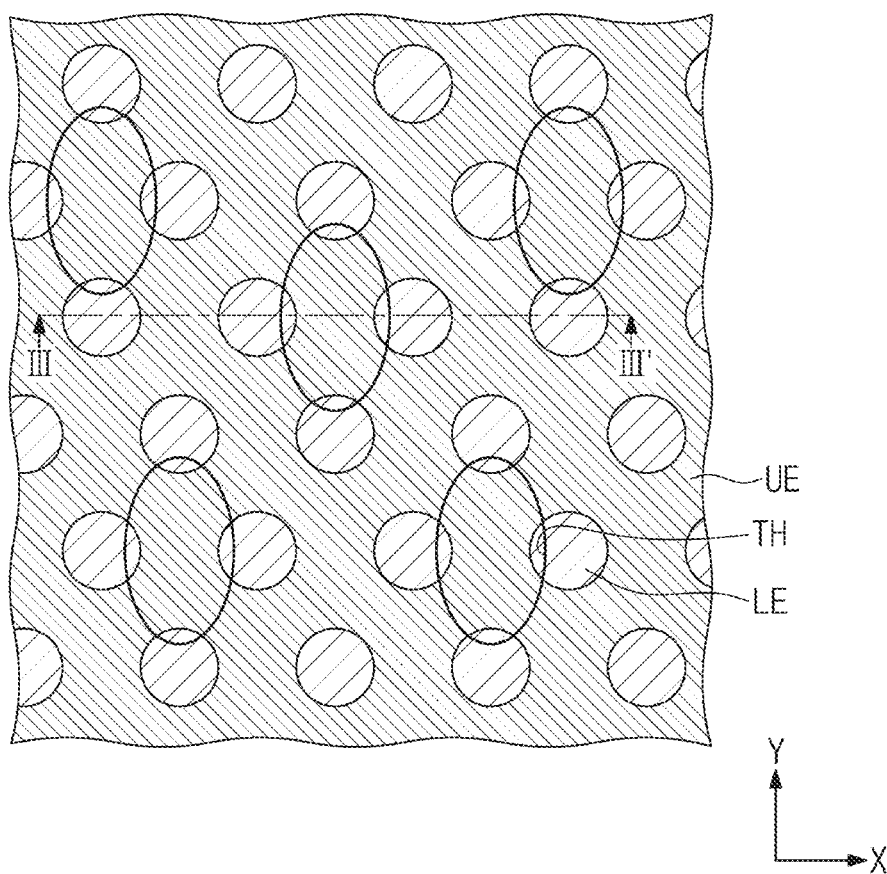
FIG. 8 illustrates a plan view showing a semiconductor device according to some example embodiments of inventive concepts.
Figure 9:
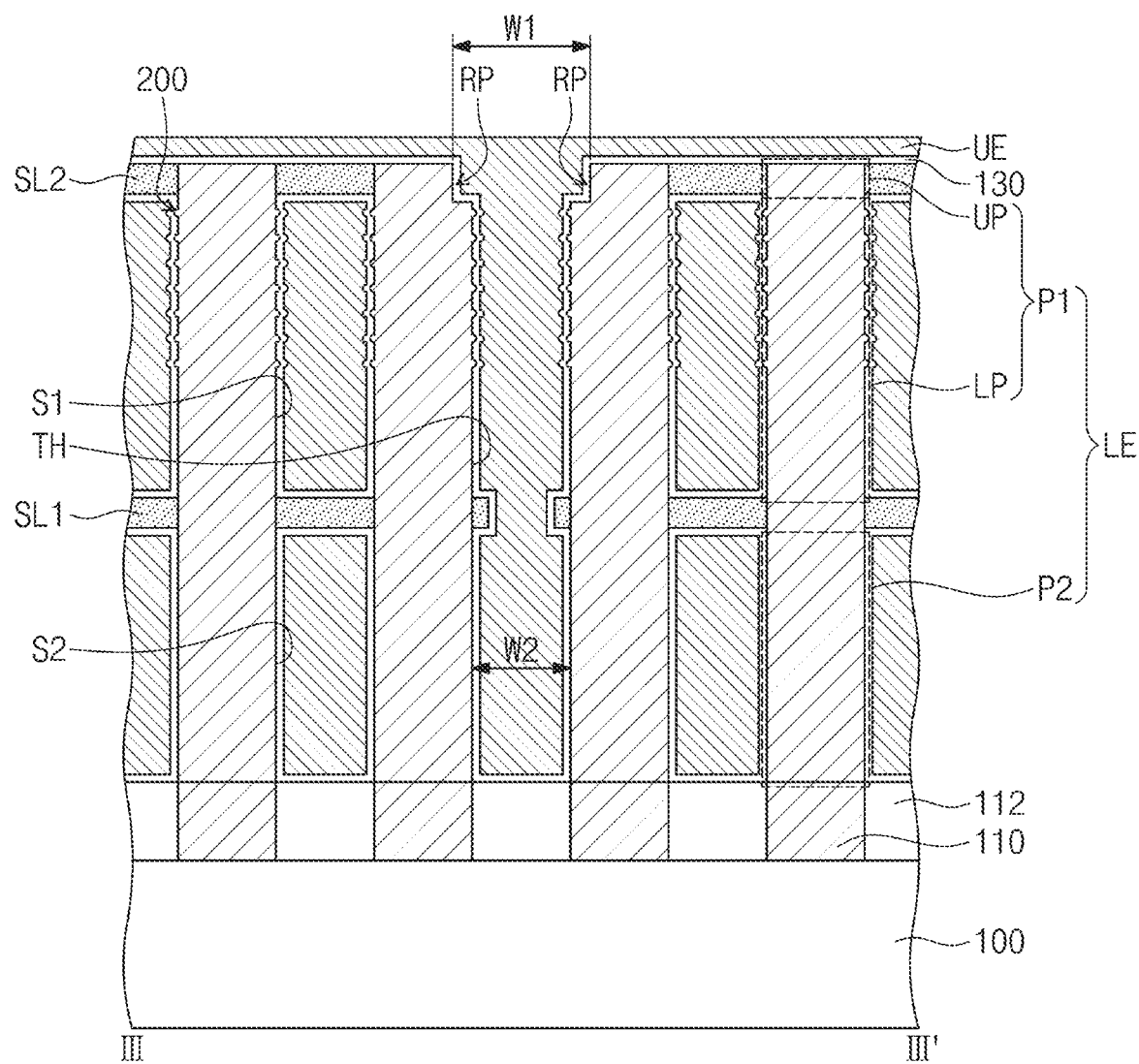
FIG. 9 illustrates a cross-sectional view taken along line of FIG. 8, showing a semiconductor device according to some example embodiments of inventive concepts.

FIG. 8 illustrates a plan view showing a semiconductor device according to some example embodiments of inventive concepts. FIG. 9 illustrates a cross-sectional view taken along line of FIG. 8, showing a semiconductor device according to some example embodiments of inventive concepts. For brevity of description, a detailed explanation of technical features the same as those of the semiconductor device discussed above may be omitted, and a difference thereof will be described.

Referring to FIGS. 8 and 9, the top electrode UE may be disposed on the bottom electrodes LE. The top electrode UE may have a thickness greater than half the second width W2 of each of the through holes TH. The top electrode UE may fill the through holes TH. The thickness of the top electrode UE may be greater than half the width of each of the first spaces S1 and than haft the width of each of the second spaces S2. In this case, the top electrode UE may fill the first spaces S1 and the second spaces S2.

FIGS. 10, 11, and 13 to 16 illustrate cross-sectional views taken along line I-I' of FIG. 1, showing a method of fabricating a semiconductor device according to some example embodiments of inventive concepts. FIGS. 12A and 12B illustrate enlarged views showing section B of FIG. 11.

Figure 10:
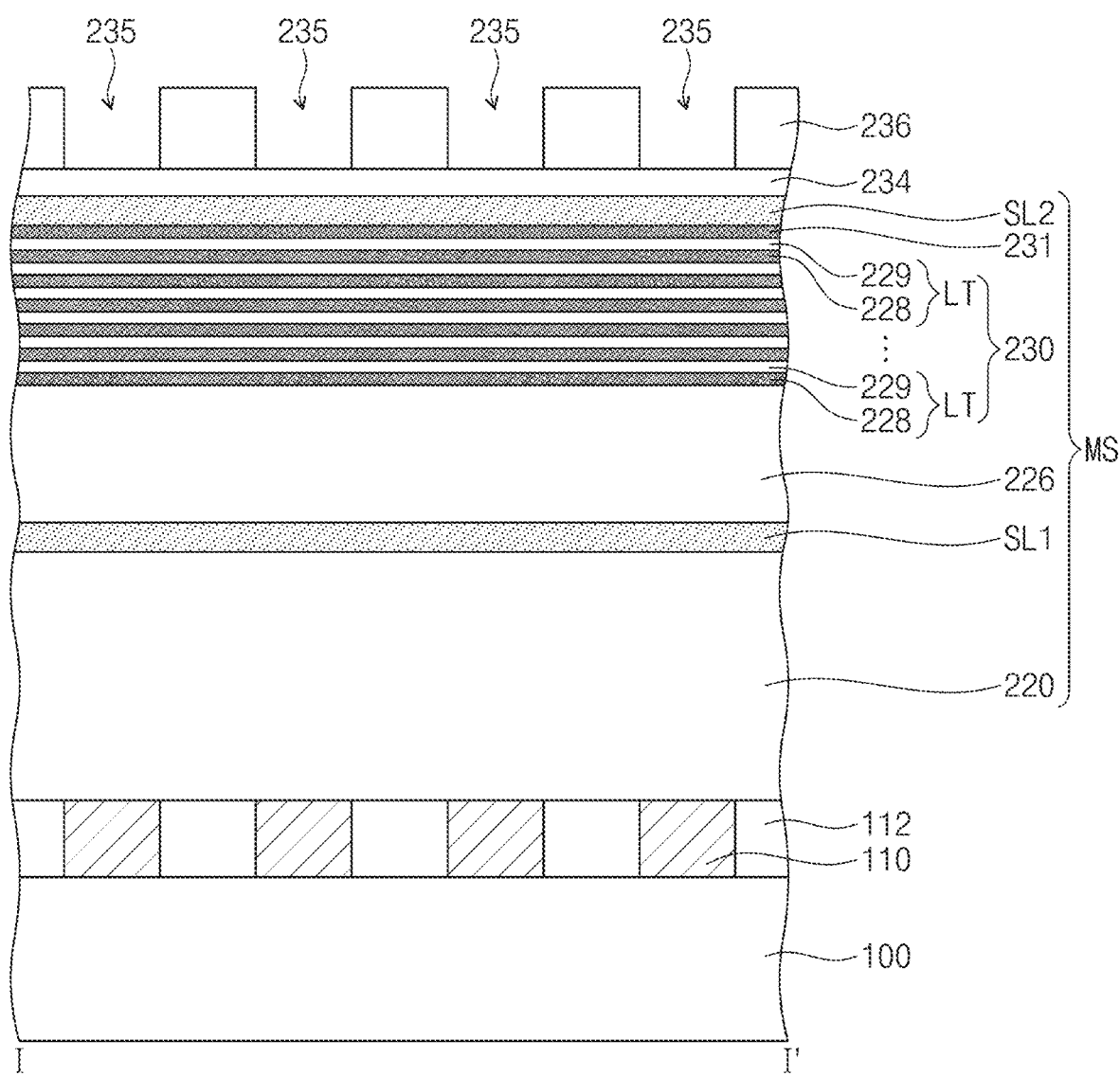
FIGS. 10, 11, and 13 to 16 illustrate cross-sectional views taken along line I-I' of FIG. 1, showing a method of fabricating a semiconductor device according to some example embodiments of inventive concepts.

Referring to FIG. 10, an interlayer dielectric layer 112 may be formed on a substrate 100. The substrate 100 may be a semiconductor substrate, such as a silicon (Si) substrate, a germanium (Ge) substrate, or a silicon-germanium (SiGe) substrate. The interlayer dielectric layer 112 may include one or more of a silicon oxide layer, a silicon nitride layer, and a silicon oxynitride layer.

Contact plugs 110 may be formed in the interlayer dielectric layer 112. The contact plugs 110 may include one or more of a semiconductor material (e.g., polysilicon), a metal-semiconductor compound (e.g., tungsten silicide), a conductive metal nitride layer (e.g., titanium nitride, tantalum nitride, or tungsten nitride), and a metallic material (e.g., titanium, tungsten, or tantalum). Although not shown, a plurality of word lines and a plurality of bit lines crossing the word lines may be formed on and/or the substrate 100. The interlayer dielectric layer 112 may be formed to cover the word lines and the bit lines. Impurity regions (not shown) may be formed in the substrate 100 on opposite sides of each of the word lines, and each of the contact plugs 110 may be connected to one of the impurity regions.

A mold structure MS may be formed on the interlayer dielectric layer 112. The mold structure MS may include a first mold layer 220, a first support layer SL1, a second mold layer 226, a buffer structure 230, a sub-buffer layer 231, and a second support layer SL2 that are sequentially formed on the interlayer dielectric layer 112. The first mold layer 220 may be, for example, a silicon oxide layer. The first support layer SL1 may include a material having an etch selectivity with respect to the first mold layer 220. The first support layer SL1 may be, for example, a silicon carbonitride (SiCN) layer. The second mold layer 226 may include a material having an etch selectivity with respect to the first support layer SL1. The second mold layer 226 may be, for example, a silicon oxide layer. The buffer structure 230 may be formed on the second mold layer 226.

The buffer structure 230 may include a plurality of layer structures LT. The plurality of layer structures LT may be vertically stacked on the second mold layer 226. For example, the number of the plurality of layer structures LT may be in a range of three to eight, but is not limited thereto. Each of the plurality of layer structures LT may include a first layer 228 and a second layer 229 that are vertically stacked. For example, the formation of the buffer structure 230 may include alternately and repeatedly stacking the first layer 228 and the second layer 229 on the second mold layer 226. The first and second layers 228 and 229 may include different materials from each other. For example, the first layer 228 may be a silicon nitride layer, and the second layer 229 may be a silicon oxide layer. Each of the first layers 228 may have a thickness of about 5 nm to about 15 nm. Each of the second layers 229 may have a thickness of about 5 nm to about 10 nm.

The sub-buffer layer 231 may be formed on the buffer structure 230. The sub-buffer layer 231 may include the same material as that of the first layer 228. For example, the sub-buffer layer 231 may include a silicon nitride layer. In other embodiments, the sub-buffer layer 231 may not be formed. In this case, an uppermost layer of the buffer structure 230 may be the first layer 228. The second support layer SL2 may be formed on the buffer structure 230. The second support layer SL2 may include a material having an etch selectivity with respect to the first and second layers 228 and 229 of the buffer structure 230. The second support layer SL2 may include, for example, a silicon carbonitride (SiCN) layer. A first mask layer 234 and a second mask layer 236 may be sequentially formed on the mold structure MS. For example, the first mask layer 234 may be a silicon nitride layer, and the second mask layer 236 may be a polysilicon layer. The second mask layer 236 may have first openings 235 that expose portions of the first mask layer 234.

Figure 11:
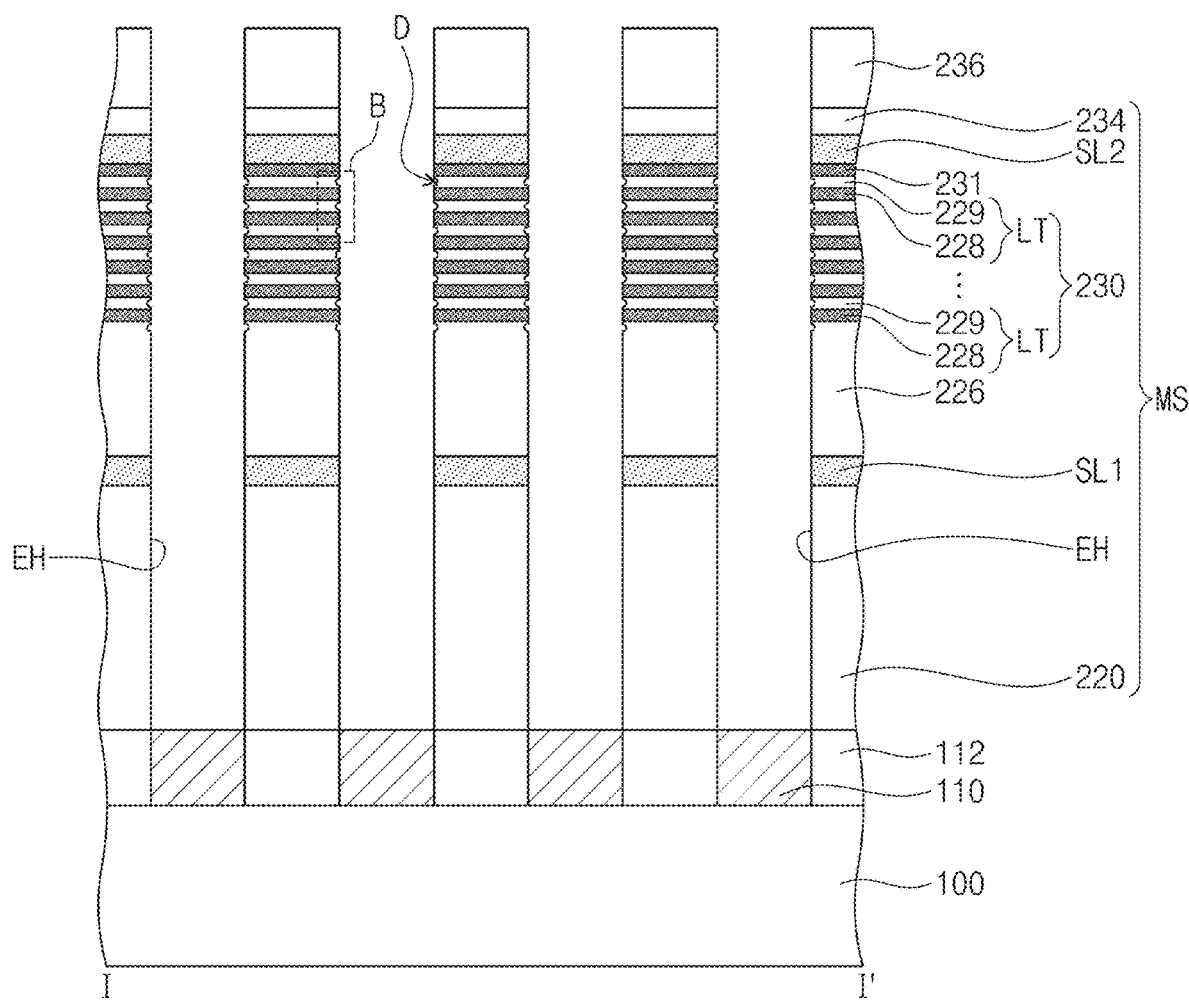
Figure 12A:
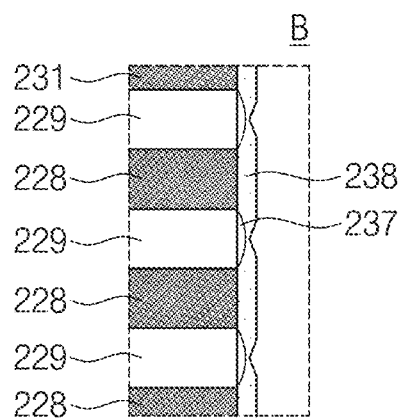
FIGS. 12A and 12B illustrate enlarged views showing section B of FIG. 11.
Figure 12B:
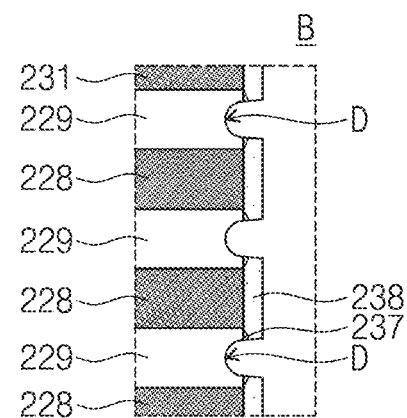

Referring to FIG. 11, an anisotropic etching process may be performed in which the second mask layer 236 is used as an etching mask to anisotropically etch the first mask layer 234 and the mold structure MS. Therefore, electrode holes EH may be formed in the mold structure MS. For example, the electrode holes EH may be formed by sequentially etching the first mask layer 234, the buffer structure 230, the second mold layer 226, the first support layer SL1, and the first mold layer 220. The anisotropic etching process may include, for example, a dry etching process. The dry etching process may use an etching gas, such as $CF_4$, $CF_4/O_2$, or $C_2F_6/O_2$. The first and second mask layers 234 and 236 may be etched and removed during the etching process. For another example, after the etching process, other etching processes may be performed separately to etch and remove the first and second mask layers 234 and 236.

Referring to FIG. 12A together with FIG. 11, when the etching gas mentioned above is used to etch the mold structure MS, the buffer structure 230 may have etch-byproducts 237 and 238 on its sidewalls exposed to the electrode holes EH. For example, the etch-byproduct 238 on the first layer 228 may be a layer formed when a silicon nitride layer is combined with the etching gas, and the etch-byproduct 237 on the second layer 229 may be a layer formed when a silicon oxide layer is combined with the etching gas. The etch-byproduct 237 may be formed when the second layer 229 is combined with the etching gas, and oxygen of the second layer 229 and carbon (C) of the etching gas may be combined with each other to produce carbon monoxide (CO) or carbon dioxide ($CO_2$). Thus, the etch-byproducts 237 formed on the second layers 229 of the buffer structure 230 may be thinner than the etch-byproducts 238 formed on the first layers 228 of the buffer structure 230. The etch-byproducts 238 formed on sidewalls of the first layers 228 may diffuse onto sidewalls of the second layers 229 interposed between the first layers 228 vertically adjacent to each other. For example, the etch-byproducts 237 of the second layers 229 and the etch-byproducts 238 of the first layers 228 may be deposited together on the sidewalls of the second layers 229. In this case, during the etching process, the sidewalls of the second layers 229 exposed to the electrode holes EH may be protected by the etch-byproducts 237 and 238 of the first and second layers 228 and 229, and as a result, the second layers 229 may have no dents D on the sidewalls thereof as shown in FIG. 12A or, even when the dents D are formed on the sidewalls of the second layers 229, the dents D may have reduced and/or minimum sizes as shown in FIG. 12B. For example, as shown in FIG. 11, the dents D may be formed on a sidewall of the second mold layer 226. For another example, the dents D may not be formed on the sidewall of the second mold layer 226.

After the anisotropic etching process, the etch-byproducts 237 and 238 may be removed by an ashing process and/or a strip process.

Figure 13:
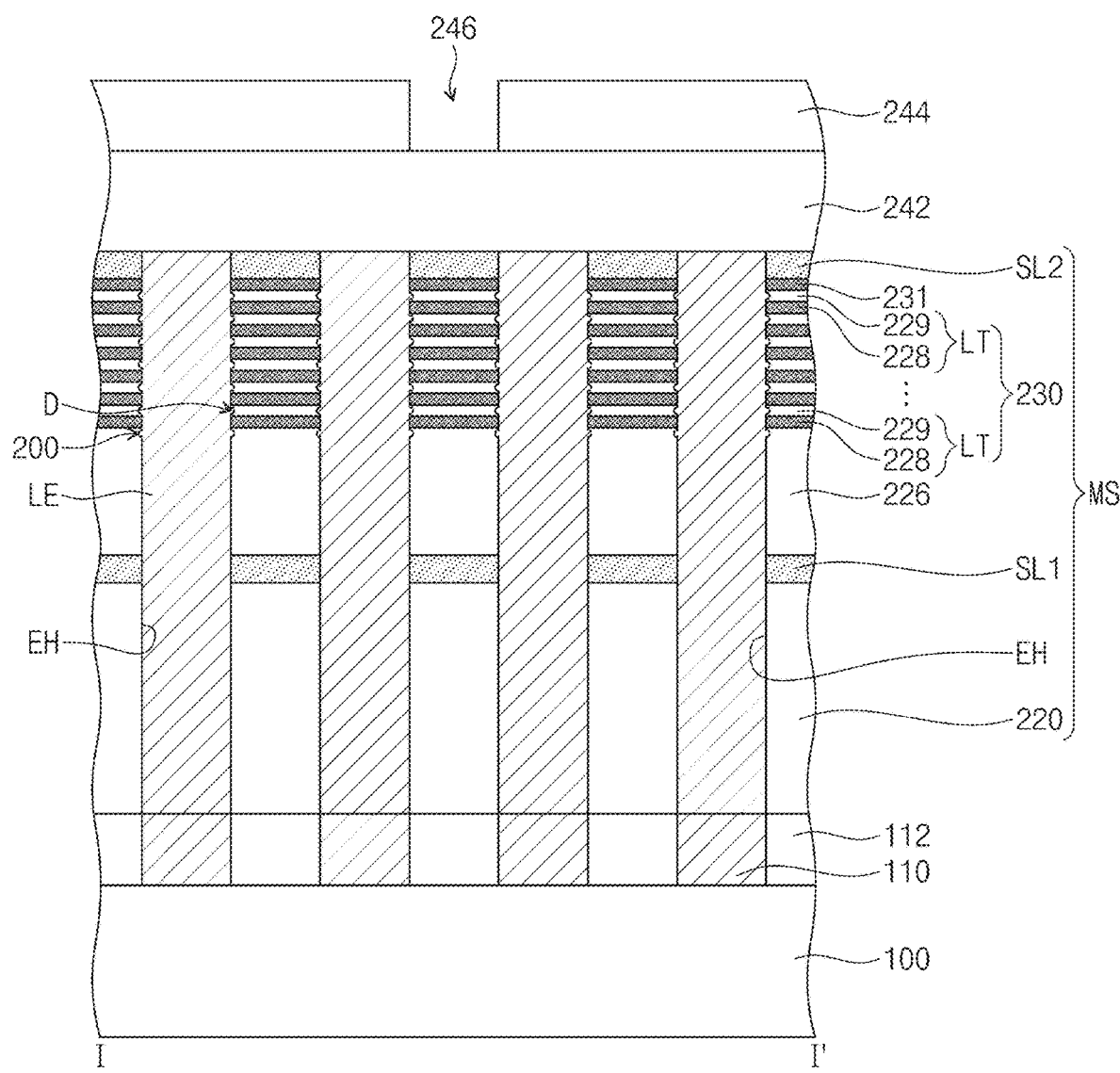

Referring to FIG. 13, bottom electrodes LE may be formed in the electrode holes EH. The formation of the bottom electrodes LE may include forming a conductive layer to fill the electrode holes EH and to cover a top surface of the mold structure MS, and then performing a planarization process on the conductive layer. The conductive layer may fill the dents D. The bottom electrodes LE may thus have a plurality of protrusions 200 that protrude from sidewalls of the bottom electrodes LE. Because the electrode holes EH have a high aspect ratio, a deposition process for forming the bottom electrodes LE may use a layer formation technique having superior step coverage characteristics. The bottom electrodes LE may be formed, for example, using chemical vapor deposition (CVD) or atomic layer deposition (ALD). For example, the bottom electrodes LE may be formed to completely fill the electrode holes EH. In this case, each of the bottom electrodes LE may have a pillar shape. For another example, the bottom electrodes LE may be formed to conformally cover sidewalls and bottom surfaces of the electrode holes EH. In this case, each of the bottom electrodes LE may have a U shape.

The bottom electrodes LE may include one or more of a metallic material, a metal nitride material, and a metal silicide material. For example, the bottom electrodes LE may be formed of a refractory metallic material, such as cobalt, titanium, nickel, tungsten, and molybdenum. For another example, the bottom electrodes LE may be formed of a metal nitride layer, such as a titanium nitride (TiN) layer, a titanium silicon nitride (TiSiN) layer, a titanium aluminum nitride (TiAlN) layer, tantalum nitride (TaN) layer, a tantalum aluminum nitride (TaAlN) layer, and a tungsten nitride (WN) layer. For another example, the bottom electrodes EL may be formed of a noble metal layer including at least one selected from the group consisting of platinum (Pt), ruthenium (Ru), and iridium (Ir). For another example, the bottom electrodes LE may be formed of a conductive noble metal oxide layer, such as PtO, $RuO_2$, and $IrO_2$, or formed of a conductive oxide layer, such as SRO ($SrRuO_3$), BSRO(($Ba,Sr)RuO_3$), CRO($CaRuO_3$), and LSCo.

A third mask layer 242 may be formed on the mold structure MS having the bottom electrodes LE therein. The third mask layer 242 may be formed of a material having an etch selectivity with respect to the second support layer SL2. The third mask layer 242 may be, for example, an amorphous carbon layer (ACL). A photoresist layer 244 may be formed on the third mask layer 242. The photoresist layer 244 may have second openings 246. Each of the second openings 246 may vertically overlap a portion of the second support layer SL2 between a pair of the bottom electrodes LE adjacent to each other in a first direction (see X of FIG. 1) and also between a pair of the bottom electrodes LE adjacent to each other in a second direction (see Y of FIG. 1) intersecting the first direction X.

Figure 14:
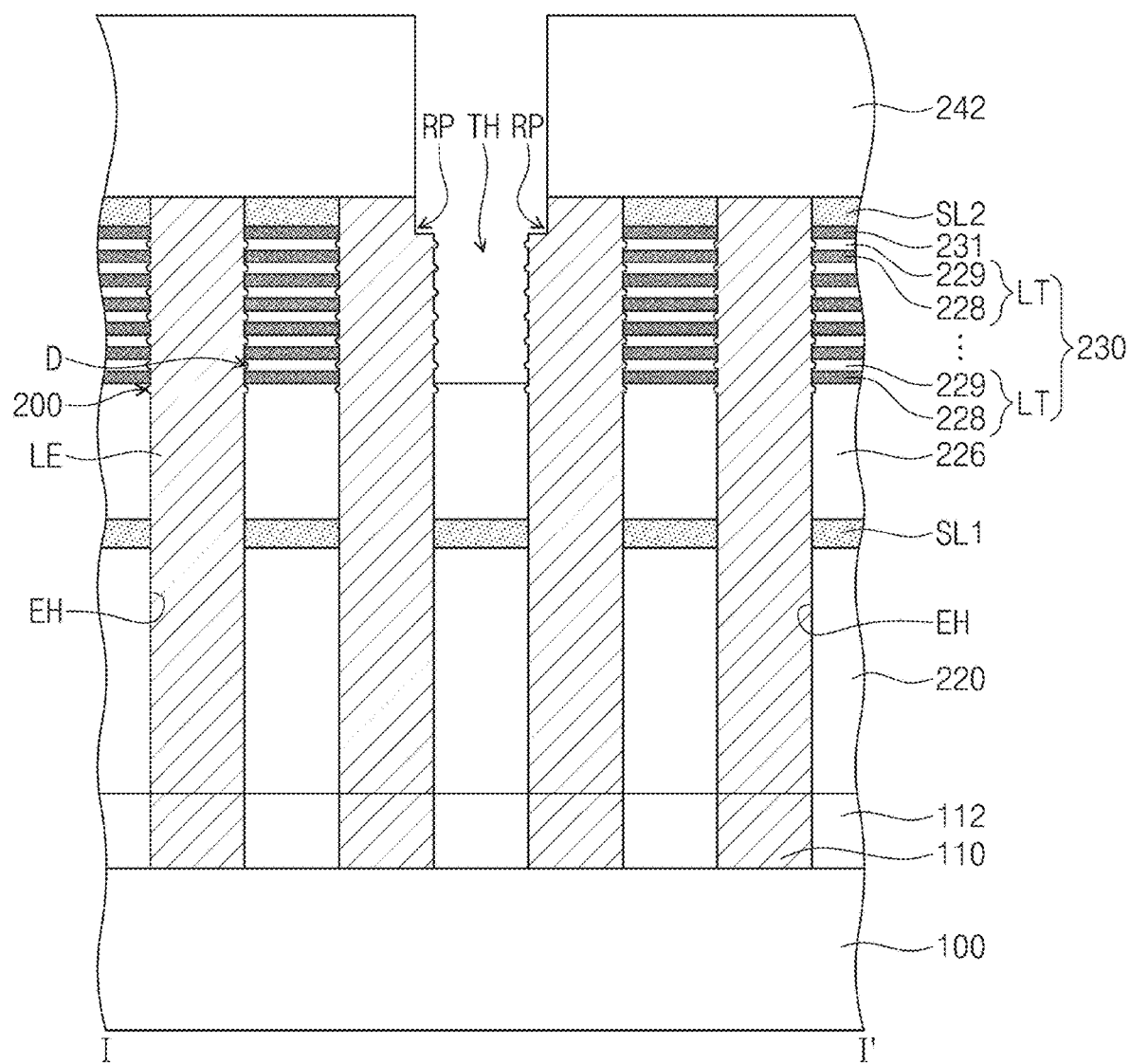

Referring to FIG. 14, an etching process may be performed in which the photoresist layer 244 is used as an etching mask to sequentially etch the third mask layer 242, the second support layer SL2, and the buffer structure 230. Therefore, through holes TH may be formed to penetrate the third mask layer 242, the second support layer SL2, and the buffer structure 230. The through holes TH may partially expose a top surface of the second mold layer 226, the sidewall of the buffer structure 230, and the sidewalls of the bottom electrodes LE. The etching process may partially etch upper portions of the bottom electrodes LE. Concave segments RP may thus be formed on portions of upper corners of the bottom electrodes LE. The concave segments RP may be recessed from top surfaces of the bottom electrodes LE. When the etching process is performed, the photoresist layer 244 may also be removed to expose a top surface of the third mask layer 242. The etching process may include, for example, a dry etching process. The dry etching process may use a $C_xF_y$ gas or a $CH_xF_y$ gas.

Figure 15:
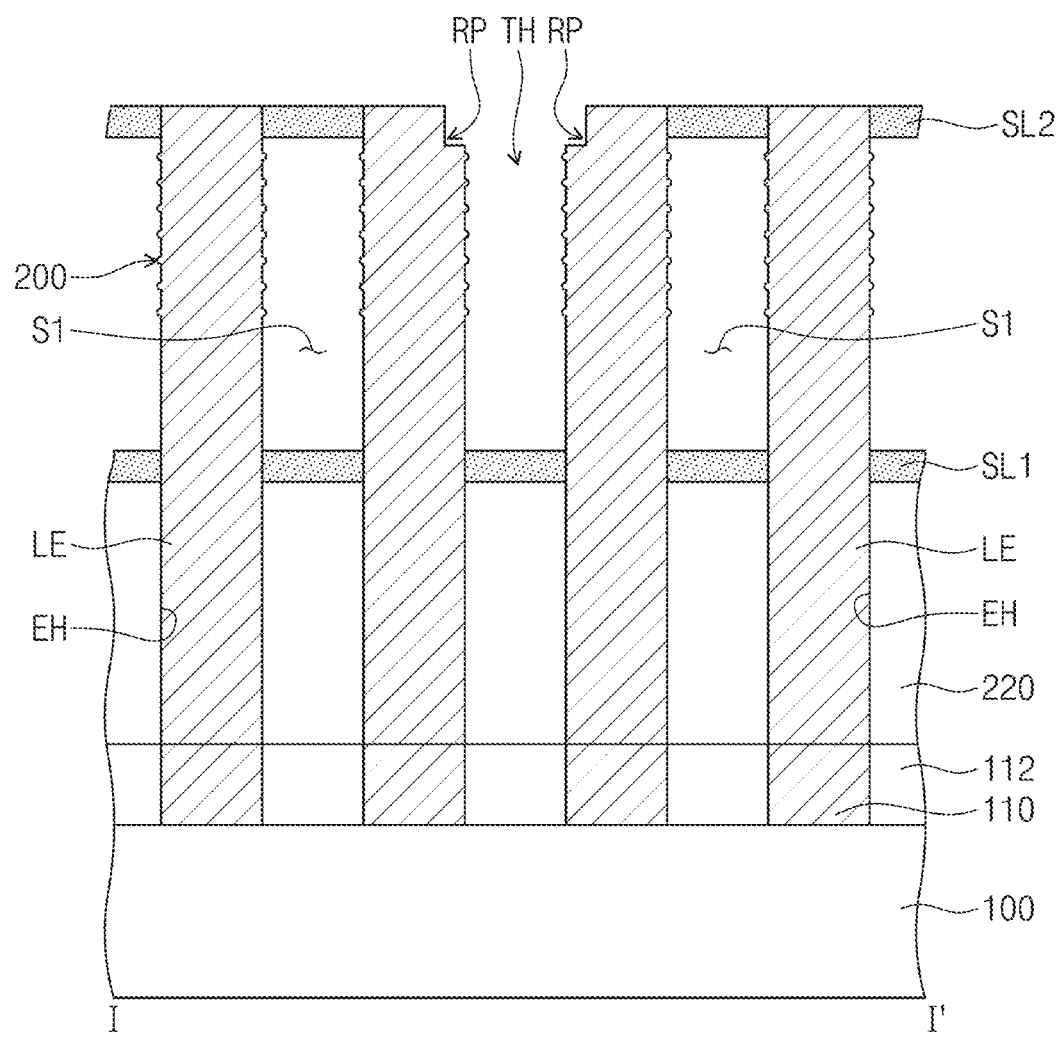

Referring to FIG. 15, the third mask layer 242 may be removed. The removal of the third mask layer 242 may expose a top surface of the second support layer SL2. The third mask layer 242 may be removed by, for example, an ashing process and/or a strip process. A removal process may be performed on the buffer structure 230 and the second mold layer 226 that are exposed to the through holes TH. The buffer structure 230 and the second mold layer 226 may be removed to form first spaces S1. The first spaces S1 may be defined by the first and second support layers SL1 and SL2 between the bottom electrodes LE. The through holes TH and the first spaces S1 may expose sidewalls of the bottom electrodes LE between the first and second support layers SL1 and SL2, a top surface of the first support layer SL1, and a bottom surface of the second support layer SL2. The buffer structure 230 and the second mold layer 226 may be removed by a wet etching process that uses an etchant having an etch selectivity with respect to the first and second support layers SL1 and SL2. For example, the etchant may include hydrofluoric acid (HF), but is not limited thereto. or $NH_4$ and HF lysate (LAL).

Figure 16:
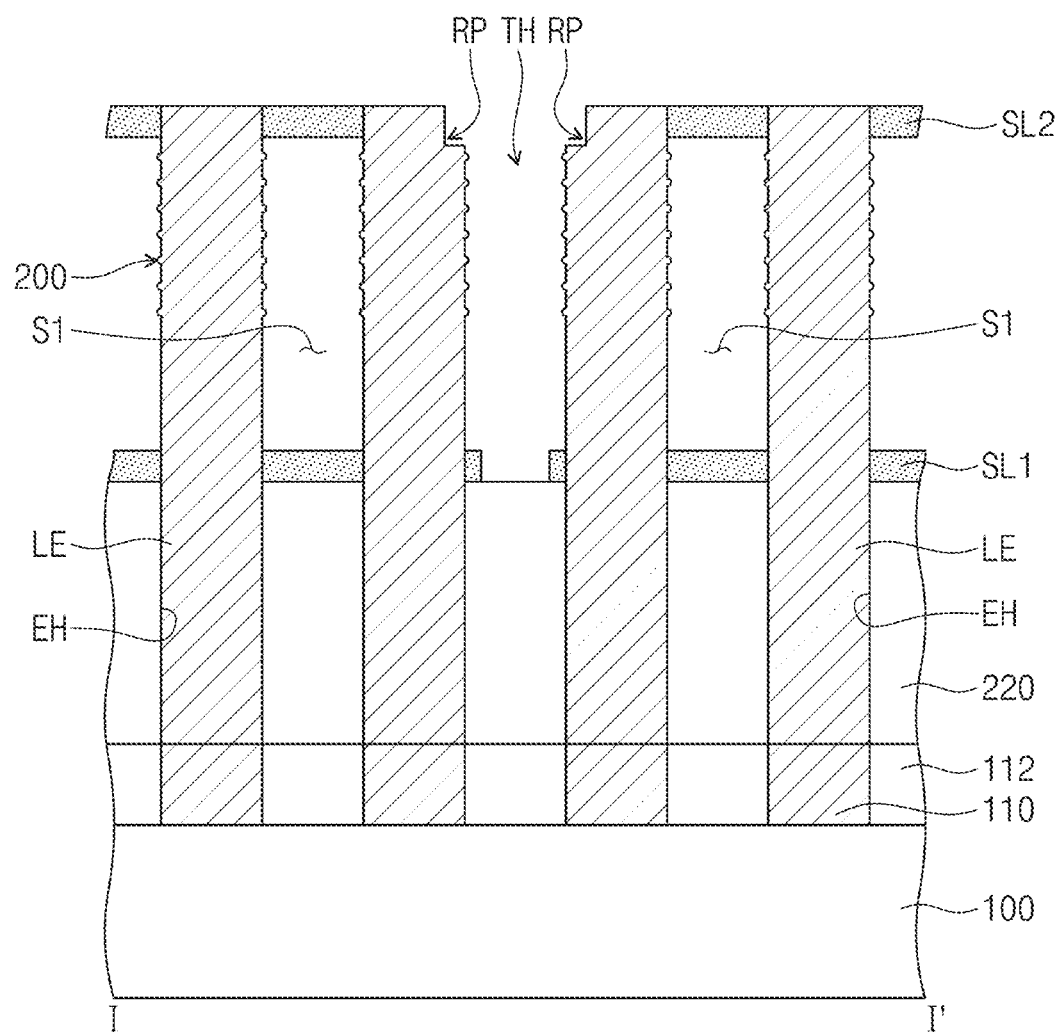

Referring to FIG. 16, an etching process may be performed to etch portions of the first support layer SL1 exposed to the through holes TH. The portions of the first support layer SL1 may thus be removed to cause the through holes TH to expose portions of a top surface of the first mold layer 220. For example, an over-etching may be conducted to remove the portions of the top surface of the first mold layer 220.

Referring back to FIG. 2, a removal process may be performed to remove the first mold layer 220 exposed by the first support layer SL1. The first mold layer 220 may be removed to form second spaces S2. The second spaces S2 may be defined by the interlayer dielectric layer 112 and the first support layer SL1 between the bottom electrodes LE. The through holes TH and the second spaces S2 may expose sidewalls of the bottom electrodes LE disposed under the first support layer SL1, a top surface of the interlayer dielectric layer 112, and a bottom surface of the first support layer SL1. The first mold layer 220 may be removed by a wet etching process that uses an etchant having an etch selectivity with respect to the first and second support layers SL1 and SL2. For example, the first mold layer 220 may be removed using hydrofluoric acid (HF) or $NH_4$ and HF (LAL).

A dielectric layer 130 may be formed on the substrate 100. The dielectric layer 130 may conformally cover the top surface of the interlayer dielectric layer 112, the sidewalls of the bottom electrodes LE, the top, bottom, and lateral surfaces of the first support layer SL1, and the top and bottom surfaces of the second support layer SL2. The dielectric layer 130 may be formed of a dielectric material that is provided by way of the through holes TH. The dielectric layer 130 may be formed using a layer deposition technique, such as atomic deposition (ALD), having superior step coverage characteristics. The dielectric layer 130 may be formed of a single layer, or a combination thereof, including at least one selected from the group consisting of metal oxide, such as $HfO_2$, $ZrO_2$, $Al_2O_3$, $La_2O_3$, $Ta_2O_3$, and $TiO_2$, and a perovskite dielectric material, such as $SrTiO_3$ (STO), $(Ba,Sr)TiO_3$(BST), $BaTiO_3$, PZT, and PLZT.

A top electrode UE may be formed on the dielectric layer 130. The top electrode UE may be formed in the through holes TH, the first spaces S1, and the second spaces S2, while covering a top surface of the dielectric layer 130. The top electrode UE may conformally cover the top surface of the dielectric layer 130. Therefore, the top electrode UE may completely fill neither the through holes TH, nor the first spaces S1, nor the second spaces S2. For another example, the top electrode UE may completely fill the through holes TH, the first spaces S1, and the second spaces S2. The top electrode UE may be formed of one or more of an impurity-doped semiconductor material, a metallic material, a metal nitride material, and a metal silicide material. The top electrode UE may be formed of a refractory metallic material, such as cobalt, titanium, nickel, tungsten, and molybdenum. The top electrode UE may be formed of metal nitride, such as titanium nitride (TiN), titanium aluminum nitride (TiAlN), and tungsten nitride (WN). The top electrode UE may be formed of metal, such as platinum (Pt), ruthenium (Ru), and iridium (Ir).

According to some example embodiments of inventive concepts, the buffer structure 230 may be formed to include the first layers 228 and the second layers 229 that are alternately and repeatedly stacked between the second mold layer 226 and the second support layer SL2. The second layers 229 may have relatively small thicknesses, and thus, when an etching process is performed to form the electrode holes EH, the second layers 229 may have no dents D on the sidewalls thereof or have the dents D with reduced and/or minimum sizes. An increased interval may then be provided between the bottom electrodes LE adjacent to each other in a horizontal direction, and as a result it may be possible to limit and/or prevent non-deposition of the top electrode UE between the bottom electrodes LE and/or to suppress connection of the bottom electrodes LE to each other.

Although some example embodiments of inventive concepts been described in connection the accompanying drawings, it will be understood to those skilled in the art that various changes and modifications may be made without departing from the technical spirit and features of inventive concepts. It will be apparent to those skilled in the art that various substitution, modifications, and changes may be thereto without departing from the scope and spirit of inventive concepts.

What is claimed is:

1. A semiconductor device, comprising:
a substrate;
a capacitor bottom electrode disposed over the substrate;
a first support layer disposed over the substrate and contacting a side surface of the capacitor bottom electrode;
a second support layer disposed over the first support layer and contacting the side surface of the capacitor bottom electrode;
a dielectric layer disposed on the capacitor bottom electrode, the first support layer and the second support layer; and
a capacitor top electrode disposed on the dielectric layer,
wherein the capacitor bottom electrode includes:
a first portion that is disposed between the first support layer and the second support layer, and disposed adjacent to the first support layer; and
a second portion that is disposed between the first support layer and the second support layer, and disposed adjacent to the second support layer,
wherein a side surface of the first portion of the capacitor bottom electrode is substantially flat, and
the second portion of the capacitor bottom electrode includes a plurality of protrusions that protrude from a side surface of the second portion of the capacitor bottom electrode.

2. The semiconductor device of claim 1, wherein the plurality of protrusions of the second portion of the capacitor bottom electrode include at least four protrusions among the plurality of protrusions of the second portion of the capacitor bottom electrode.

3. The semiconductor device of claim 1, wherein the plurality of protrusions of the second portion of the capacitor bottom electrode are spaced apart from each other in a direction that is perpendicular to a top surface of the substrate.

4. The semiconductor device of claim 1, wherein the capacitor bottom electrode includes a third portion that is disposed between the plurality of protrusions of the second portion of the capacitor bottom electrode, and
a side surface of the third portion of the capacitor bottom electrode is substantially flat.

5. The semiconductor device of claim 1, wherein the capacitor bottom electrode includes a fourth portion that is disposed on the second portion of the capacitor bottom electrode, and the fourth portion of the capacitor bottom electrode includes a recess.

6. The semiconductor device of claim 1, further comprising:
an insulation layer that is disposed on the substrate; and
a contact plug that passes through the insulation layer,
wherein the capacitor bottom electrode includes a fifth portion that is disposed between the contact plug and the first portion of the capacitor bottom electrode, and
a side surface of the fifth portion of the capacitor bottom electrode is substantially flat.

7. The semiconductor device of claim 1, wherein the second support layer includes an opening that exposes a side surface of each of four capacitor bottom electrodes.

8. The semiconductor device of claim 1, wherein at least one of the first support layer or the second support layer includes silicon carbon nitride (SiCN).

9. The semiconductor device of claim 1, wherein the capacitor bottom electrode is cylinder-shaped with an upper opened end.

10. The semiconductor device of claim 1, wherein the capacitor bottom electrode is cylinder-shaped with a filled interior.

11. The semiconductor device of claim 1, wherein each of the capacitor bottom electrode and the capacitor top electrode includes titanium nitride (TiN).

12. The semiconductor device of claim 1, wherein the dielectric layer includes hafnium oxide (HfO2), zirconium oxide (ZrO2) and aluminum oxide (Al2O3).

13. The semiconductor device of claim 1, wherein the dielectric layer includes a plurality of protrusions that protrude from a side surface of the dielectric layer in a direction that is parallel to a top surface of the substrate.

14. The semiconductor device of claim 1, wherein at least one of the plurality of protrusions of the second portion of the capacitor bottom electrode includes a convex surface.

15. The semiconductor device of claim 1, wherein the plurality of protrusions of the second portion of the capacitor bottom electrode have different sizes from each other.

16. The semiconductor device of claim 1, wherein a vertical thickness of each of the plurality of protrusions of the second portion of the capacitor bottom electrode is about 3 nm to about 7 nm.

17. A semiconductor device, comprising:
a substrate;
an insulation layer disposed on the substrate;
a contact plug passing through the insulation layer;
a pillar-shaped bottom electrode disposed on the contact plug;
a first support layer disposed over the substrate and contacting a side surface of the pillar-shaped bottom electrode;
a second support layer disposed over the first support layer and contacting the side surface of the pillar-shaped bottom electrode;
a dielectric layer disposed on the pillar-shaped bottom electrode, the first support layer and the second support layer; and
a top electrode disposed on the dielectric layer,
wherein the pillar-shaped bottom electrode includes:
a first portion that is disposed between the contact plug and the first support layer;
a second portion that is disposed between the first support layer and the second support layer, and disposed adjacent to the first support layer;

a third portion that is disposed between the first support layer and the second support layer, and disposed adjacent to the second support layer; and a fourth portion that is disposed on the third portion of the pillar-shaped bottom electrode, wherein a side surface of the third portion of the pillar-shaped bottom electrode includes a plurality of protrusions, and the fourth portion of the pillar-shaped bottom electrode includes a recess.

18. The semiconductor device of claim 17, wherein at least one of the first support layer or the second support layer includes silicon carbon nitride (SiCN).

19. The semiconductor device of claim 17, wherein a side surface of at least one of the first portion or the second portion of the pillar-shaped bottom electrode is substantially flat.

20. The semiconductor device of claim 17, wherein the pillar-shaped bottom electrode includes a fifth portion that is disposed between the plurality of protrusions of the third portion of the pillar-shaped bottom electrode, and a side surface of the fifth portion of the pillar-shaped bottom electrode is substantially flat.

* * * * *